(12) United States Patent
Hosoki

(10) Patent No.: US 8,717,515 B2
(45) Date of Patent: May 6, 2014

(54) LED SUBSTRATE, BACKLIGHT UNIT, AND LIQUID CRYSTAL DISPLAY DEVICE

(75) Inventor: Mitsuru Hosoki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 35 days.

(21) Appl. No.: 13/520,489

(22) PCT Filed: Nov. 18, 2010

(86) PCT No.: PCT/JP2010/070623
§ 371 (c)(1),
(2), (4) Date: Jul. 3, 2012

(87) PCT Pub. No.: WO2011/086761
PCT Pub. Date: Jul. 21, 2011

(65) Prior Publication Data
US 2013/0027637 A1    Jan. 31, 2013

(30) Foreign Application Priority Data
Jan. 14, 2010    (JP) ................................. 2010-005521

(51) Int. Cl.
*G02F 1/1335*    (2006.01)

(52) U.S. Cl.
USPC ............................................. 349/69; 349/65

(58) Field of Classification Search
USPC ..................................................... 349/65, 69
See application file for complete search history.

(56) References Cited

U.S. PATENT DOCUMENTS

| | | | |
|---|---|---|---|
| 2007/0170452 A1 | 7/2007 | Kurokawa et al. | |
| 2008/0024694 A1* | 1/2008 | Kondo et al. | 349/58 |
| 2009/0021183 A1* | 1/2009 | Ye et al. | 315/291 |
| 2011/0007239 A1 | 1/2011 | Hamada | |

FOREIGN PATENT DOCUMENTS

| | | |
|---|---|---|
| JP | 2004-103993 A | 4/2004 |
| JP | 3102096 U | 7/2004 |
| JP | 2007-305435 A | 11/2007 |
| JP | 2008-311234 A | 12/2008 |
| WO | 2006/134839 A1 | 12/2006 |
| WO | 2009/118941 A1 | 10/2009 |

OTHER PUBLICATIONS

Official Communication issued in International Patent Application No. PCT/JP2010/070623, mailed on Dec. 14, 2010.

* cited by examiner

*Primary Examiner* — Phu Vu
(74) *Attorney, Agent, or Firm* — Keating & Bennett, LLP

(57) ABSTRACT

Provided is an LED substrate capable of being downsized in width. In addition, provided are LED substrates that can be disposed laterally in an efficient fashion. Each LED substrate (20) has a configuration that two single terminal connectors of a light-source-side substrate connector (single terminal connector) 40 including a light-source-side terminal 41 and a ground-side substrate connector (single terminal connector) 50 including a ground-side terminal 51 are included and disposed at right and left ends of each LED substrate so as to sandwich therebetween a plurality of LEDs (21) connected in series.

8 Claims, 14 Drawing Sheets

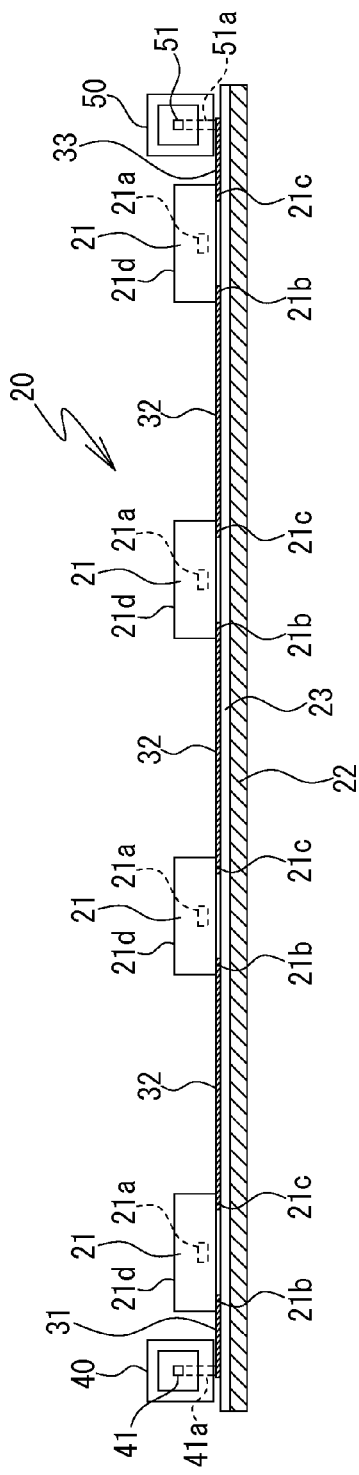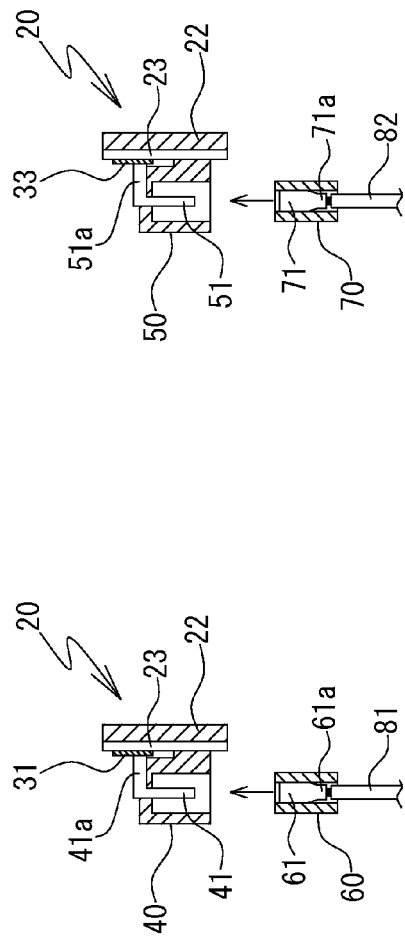

LED SUBSTRATE, BACKLIGHT UNIT, AND LIQUID CRYSTAL DISPLAY DEVICE

TECHNICAL FIELD

The present invention relates to an LED substrate including a plurality of LEDs, a backlight unit including the LED substrate, and a liquid crystal display device including a liquid crystal display panel and the backlight unit that is disposed behind the liquid crystal display panel.

BACKGROUND ART

A liquid crystal display device including a transmissive liquid crystal display panel includes a backlight unit that is disposed behind the liquid crystal display panel to project light thereonto. Aside (edge) backlight unit is known as this kind of backlight unit, which includes a light guide plate having a plate shape that is made from a transparent material such as an acrylate resin, and a light source that includes a cold cathode tube (fluorescent lamp) or an LED (Light-Emitting Diode) that is disposed along one side or more than one side of the light guide plate. The side backlight unit described above has an advantage such that a thin profile thereof can be easily achieved compared with a direct backlight unit including a light source disposed behind a liquid crystal display panel.

In particular, a liquid crystal display device that includes an LED as a light source of a side backlight unit has the advantages of long life and high luminous efficiency, and thus has been receiving attention. FIG. 10 is an exploded perspective view showing a schematic configuration of a liquid crystal display device including this kind of side backlight unit including LEDs. FIG. 11 is a cross-sectional view showing a relevant portion of the same.

As shown in FIG. 10, a liquid crystal display device 100 includes a bezel 102, a liquid crystal display panel 103, and a backlight unit 104.

The bezel 102 has a square frame shape with an opening so as to cover edge portions of the liquid crystal display panel 103, and is arranged to, together with a backlight chassis 114, ensure strength of the entire liquid crystal display device 100. The liquid crystal display panel 103 includes two glasses that are bonded together, and liquid crystals are filled in a space between the glasses. The liquid crystal display panel 103 is capable of displaying an image on its front face.

The backlight unit 104 includes the backlight chassis 114 having the shape of a box of low height. The chassis 114 houses optical sheets 107 to 109, a light guide plate 111, a reflection sheet 113, and two LED substrates 120.

As shown in FIG. 11, the light guide plate 111 includes a light incidence surface 111a arrange to obtain light from the LEDs 121 of the LED substrates 120, and a light emitting surface 111b arrange to emit the light upward (in a direction to project the light), which is obtained from the light incidence surface 111a. The light incidence surface 111a is defined by a given side surface of the light guide plate 111, and the light emitting surface 111b is defined by a front surface of the light guide plate 111.

The reflection sheet 113 is disposed so as to cover a back surface 111c of the light guide plate 111, which is the opposite surface to the light emitting surface 111b. The optical sheets 107 to 109 define optical sheets such as a diffusion sheet and a lens sheet, and are disposed above the light emitting surface 111b of the light guide plate 111.

The optical sheets 107 to 109, the light guide plate 111 and the reflection sheet 113 are stacked and fixed onto a bottom plate 114a of the backlight chassis 114 by a frame 105.

In addition, the LEDs 121 provided to the LED substrates 120 are disposed close to the light incidence surface 111a of the light guide plate 111. Further, light emitting surfaces 121d of the LEDs 121 are disposed along the light incidence surface 111a of the light guide plate 111, having a given space therebetween so as to be opposed to the light incidence surface 111a. In this case, the two LED substrates 120 are fixed so as to be disposed laterally while standing on a fixing plate 115 having the shape of the letter "L" that is provided so as to stand on the bottom plate 114a in the vicinity of a side wall 114b of the backlight chassis 114.

Each LED substrate 120 includes wiring patterns 131, 132 and 133 that are formed on a radiating plate made from metal such as aluminum while sandwiching therebetween an insulating layer, and the LEDs 121 are disposed on each LED substrate 120 so as to be connected to the wiring patterns 131, 132 and 133, as shown in FIG. 12.

In this case, four LEDs 121 are disposed linearly along a longitudinal direction of each LED substrate 120, and connected to one another in series by the connecting patterns 131 and 132.

The first LED 121 from the right end of each LED substrate 120 is connected to one end of the light source pattern 131. The other end of the light source pattern 131 is connected to a light-source-side terminal (positive terminal) 141 of a substrate connector 140 disposed at the right end of each LED substrate 120.

The first LED 121 from the left end of each LED substrate 120 (the fourth LED 121 from the right end) is connected to one end of the ground pattern 133. The other end of the ground pattern 133, which extends from the left end of each LED substrate 120 so as to be folded back in a rightward direction along the longitudinal direction of each LED substrate 120, is connected to a ground-side terminal (negative terminal) 142 of the substrate connector 140.

In this case, the substrate connectors 140 have a configuration of being connected to a power substrate 118 included in the liquid crystal display device 100 via cable connectors 150 and cables 161 and 162 arranged to be fitted and connected to the substrate connectors 140.

In the LED substrates 120 having the configuration described above, the substrate connectors 140 connected to the LEDs 121 are disposed at either different ones of right and left ends of the LED substrates 120. Thus, when the two LED substrates 120 are disposed laterally as shown in FIG. 13, the substrate connectors 140 of the LED substrates 120 are disposed so as not to be adjacent to each other by disposing the LED substrate 120 to the left, on which the substrate connector 140 is disposed at the left end, and disposing the LED substrate 120 to the right, on which the substrate connector 140 is disposed at the right end. This configuration allows a distance P2 between the first LED 121 from the right end of the left LED substrate 120 and the first LED 121 from the left end of the right LED substrate 120 to be equal to a distance P1 between the adjacent LEDs 121 (P2=P1). Thus, the light from the LEDs 121 of the two LED substrates 120 can uniformly enter the light incidence surface 111a of the light guide plate 111.

In this case, if the LED substrate 120 is disposed to the left, on which the substrate connector 140 is disposed at the right end, and the LED substrate 120 is disposed to the right, on which the substrate connector 140 is disposed at the right end as shown in FIG. 14A, a problem arises such that the cable connector 150 and the cables 161 and 162 arranged to be fitted and connected to the substrate connector 140 of the left LED substrate 120 interfere with a left end portion or the LED 121 of the right LED substrate 120.

In addition, the ends of the LED substrates 120 on the sides of the substrate connectors 140 are longer by a size of the substrate connectors 140, so that a distance P3 between the first LED 121 from the right end of the left LED substrate 120 and the first LED 121 from the left end of the right LED substrate 120 is longer than the distance P1 between the adjacent LEDs 121 (P3>P1) as shown in FIG. 14A. Thus, the light from the LEDs 121 of the two LED substrates 120 cannot uniformly enter the light incidence surface 111*a* of the light guide plate 111, which causes a problem such that luminance on the light emitting surface 111*b* of the light guide plate 111 becomes nonuniform.

In order to prevent these problems, when the two LED substrates 120 are disposed laterally as shown in FIG. 13, the LED substrates 120 of two different kinds are prepared, on which the substrate connectors 140 are disposed at different ends of right and left ends, and disposed so as to have the configuration that the LED substrate 120 is disposed to the left, on which the substrate connector 140 is disposed at the left end, and the LED substrate 120 is disposed to the right, on which the substrate connector 140 is disposed at the right end. A prior art literature of the present invention relates to is provided below.

CITATION LIST

Patent Literature

PTL 1: JP2004-103993

SUMMARY OF INVENTION

Technical Problem

However, because each of these LED substrates 120 has a configuration of including the ground pattern 133 that is adjacent to the LEDs 121, which are disposed linearly along the longitudinal direction of the LED substrate 120 and connected to one another in series, in a width direction of the LED substrate 120, and extends in the longitudinal direction of the LED substrate 120, there is a problem in downsizing the LED substrates 120 in the width direction (direction perpendicular to the longitudinal direction).

Because of this configuration, the width of the LED substrates 120 is much wider than the width of the LEDs 121 included on the LED substrates 120. Thus, the backlight chassis 114 has a configuration such that a convex portion 114*c*, which defines a portion of the bottom plate 114*a* that is protruded downward by a width for including the ground patterns 133 of the LED substrates 120, is provided, the fixing plate 115 stands on the convex portion 114*c*, and the LED substrates 120 are fixed to the fixing plate 115, as shown in FIG. 11. However, the convex portion 114*c*, which is protruded downward from the bottom plate 114*a* of the backlight chassis 114, hinders achieving a thin profile of the backlight unit 104, in other words, hinders achieving a thin profile of the liquid crystal display device 100.

In particular, a thin profile of the liquid crystal display device 100 has been highly required recently in order to improve the design property of a liquid crystal display device such as a wall-hanging liquid crystal display device, so that the LED substrates 120 are desired to be downsized in width.

In addition, accompanied by recent increases in the size of a screen of the liquid crystal display panel 103, the backlight unit 104 increases in size, in other words, the area of the light guide plate 111 increases, so that three or more than three LED substrates 120 are sometimes desired to be disposed laterally along the light incidence surface 111*a* of the light guide plate 111.

However, because the LED substrates 120 of two different kinds described above have the configurations that the substrate connectors 140 connected to the LEDs 121 are disposed at either different ones of right and left ends of the LED substrates 120, the three or more than three LED substrates 120, when disposed laterally, have a problem such that the distance between the adjacent LEDs 121 of the two adjacent LED substrates 120 is not equal to the distance between the adjacent LEDs 121 of each LED substrate 120.

For example, when the three LED substrates 120 are disposed laterally as shown in FIG. 14B, the LED substrate 120 is disposed to the left, on which the substrate connector 140 is disposed at the left end, and the LED substrate 120 is disposed in the middle, on which the substrate connector 140 is disposed at the right end. Thus, distances P1 (=P2) between the LEDs 121 of the two LED substrates 120 can be made uniform. However, a distance P3 between the first LED 121 from the right end of the middle LED substrate 120, on which the substrate connector 140 is disposed at the right end, and the first LED 121 from the left end of the right LED substrate 120, on which the substrate connector 140 is disposed at the right end, is longer than the distance P1 between the adjacent LEDs 121 (P3>P1) as shown in FIG. 14B, which causes a problem of nonuniform distances between the LEDs 121 of the two LED substrates 120.

The present invention is made in view of the problems described above, and an object of the present invention is to provide an LED substrate including a plurality of LEDs that is capable of being downsized in width, and a plurality of the LED substrates that are capable of being disposed laterally in an efficient fashion such that the distances between the adjacent LEDs are uniform, a backlight unit including the LED substrates, and a liquid crystal display device including the backlight unit.

Solution to Problem

To achieve the objects and in accordance with the purpose of the present invention, an LED substrate of a preferred embodiment of the present invention includes a long radiating plate made from metal, an insulating layer disposed on an upper surface of the radiating plate, a plurality of LEDs disposed on an upper surface of the insulating layer linearly along a longitudinal direction of the radiating plate and connected to each other in series, a light source pattern disposed at one end on the upper surface of the insulating layer and connected to the first LED from the one end, a ground pattern disposed at the other end on the upper surface of the insulating layer and connected to the first LED from the other end, a first connector disposed at one end on the upper surface of the insulating layer and including a light-source-side terminal, and a second connector disposed at the other end on the upper surface of the insulating layer and including a ground-side terminal, wherein the light source pattern is connected to the light-source-side terminal of the first connector, and wherein the ground pattern is connected to the ground-side terminal of the second connector.

It is preferable that the first connector is disposed in a direction such that an insertion direction of a counterpart connector arranged to be fitted and connected to the first connector is parallel to a width direction of the radiating plate, the width direction being perpendicular to the longitudinal direction of the radiating plate, and wherein the second connector is disposed in a direction such that an insertion direction of a counterpart connector arranged to be fitted and connected to the second connector is parallel to the width direction of the radiating plate.

In another aspect of the present invention, a backlight unit of a preferred embodiment of the present invention includes a light guide plate having a plate shape, an LED substrate disposed on a side surface of the light guide plate, and a chassis made from metal and arranged to house the light guide plate and the LED substrate, wherein the LED substrate includes a long radiating plate made from metal, an insulating layer disposed on an upper surface of the radiating plate, a plurality of LEDs disposed on an upper surface of the insulating layer linearly along a longitudinal direction of the radiating plate and connected to each other in series, a light source pattern disposed at one end on the upper surface of the insulating layer and connected to the first LED from the one end, a ground pattern disposed at the other end on the upper surface of the insulating layer and connected to the first LED from the other end, a first connector disposed at one end on the upper surface of the insulating layer and including a light-source-side terminal, and a second connector disposed at the other end on the upper surface of the insulating layer and including a ground-side terminal, wherein the light source pattern is connected to the light-source-side terminal of the first connector, and wherein the ground pattern is connected to the ground-side terminal of the second connector.

It is preferable that the first connector is disposed in a direction such that an insertion direction of a counterpart connector arranged to be fitted and connected to the first connector is parallel to a width direction of the radiating plate, the width direction being perpendicular to the longitudinal direction of the radiating plate, and wherein the second connector is disposed in a direction such that an insertion direction of a counterpart connector arranged to be fitted and connected to the second connector is parallel to the width direction of the radiating plate.

It is preferable that the LED substrate further includes a through-hole that goes through the insulating layer and the radiating plate, and a fixing plate made from metal that is disposed to stand on the chassis, wherein the LED substrate is fixed to the fixing plate by a screw inserted in the through-hole.

It is preferable that the backlight unit further includes a thermal conductive sheet disposed between the fixing plate and the radiating plate of the LED substrate.

Yet, in another aspect of the present invention, a liquid crystal display device of a preferred embodiment of the present invention includes a liquid crystal display panel, and the backlight unit of the above-described embodiment of the present invention that is disposed behind the liquid crystal display panel.

Advantageous Effects of Invention

In the LED substrate, the backlight unit and the liquid crystal display device having the configurations described above, the two connectors of the first connector (single terminal connector) including the light-source-side terminal and the second connector (single terminal connector) including the ground-side terminal are included and disposed at the right and left ends of the LED substrate so as to sandwich therebetween the LEDs connected in series. Thus, it is unnecessary to provide a ground pattern shown in FIG. 12 and explained above in the description of Background Art, which is adjacent to the LEDs, which are disposed linearly along the longitudinal direction of the LED substrate and connected to one another in series, in the width direction of the LED substrate, and extends linearly along the longitudinal direction of the LED substrate.

Thus, downsizing (decreasing) in width of the LED substrate by a width that is required in order to include the ground pattern disposed linearly along the longitudinal direction of the LED substrate can be achieved, whereby a thin profile of the backlight unit, in other words, a thin profile of the liquid crystal display device can be achieved, which improves the design property of the liquid crystal display device.

In addition, the LED substrate of the present invention has the configuration that the two connectors of the first connector (single terminal connector) including the one light-source-side terminal and the second connector (single terminal connector) including the one ground-side terminal are included and disposed at the right and left ends of the LED substrate so as to sandwich therebetween the LEDs connected in series, which is different from the configuration of the conventional connector (double terminal connector) 140 including the light-source-side terminal 141 and the ground-side terminal 142. Thus, the right and left ends of the LED substrate can have the symmetrically same shape, for example.

That is, disposing the first connector to the left of the leftmost LED and disposing the second connector to the right of the rightmost LED allows the right and left ends of the LED substrates to have the same shape. In addition, the first and second connectors define small-sized single terminal connectors, each of which includes one terminal. Thus, the spaces of the first and second connectors (the areas where the first and second connectors are disposed) can be made smaller than the space of the conventional double terminal connector 140, which includes two terminals.

Thus, the distances between the LEDs of the plurality of LED substrates can be made uniform even when the plurality of LED substrates are disposed laterally, which prevents the problem that the distance P3 between the LEDs 121 of the two adjacent LED substrates 120 is longer than the distance P1 between the LEDs 121 of each LED substrate 120, which is shown in FIGS. 14A and 14B and explained above in the description of Background Art.

Further, because the right and left ends of the LED substrate have the same shape, the LED substrates of one kind having an above-described configuration can suffice when two, three or more than three LED substrates are disposed laterally. Thus, it is unnecessary to prepare LED substrates of two different kinds on which substrate connectors are disposed at either different ones of right and left ends of the LED substrates, which are conventionally used, whereby the number of components can be reduced to save a cost.

BRIEF DESCRIPTION OF DRAWINGS

FIG. 5A is a vertical cross-sectional view showing the LED substrate shown in FIG. 3, FIG. 5B is a longitudinal cross-sectional view showing a light-source-side substrate connector of the LED substrate shown in FIG. 5A, and FIG. 5C is a longitudinal cross-sectional view showing a ground-side substrate connector of the LED substrate shown in FIG. 5A.

DESCRIPTION OF EMBODIMENTS

A detailed description of an LED substrate, a backlight unit, and a liquid crystal display device of preferred embodiments of the present invention will now be provided with reference to the accompanying drawings.

Figure 1:
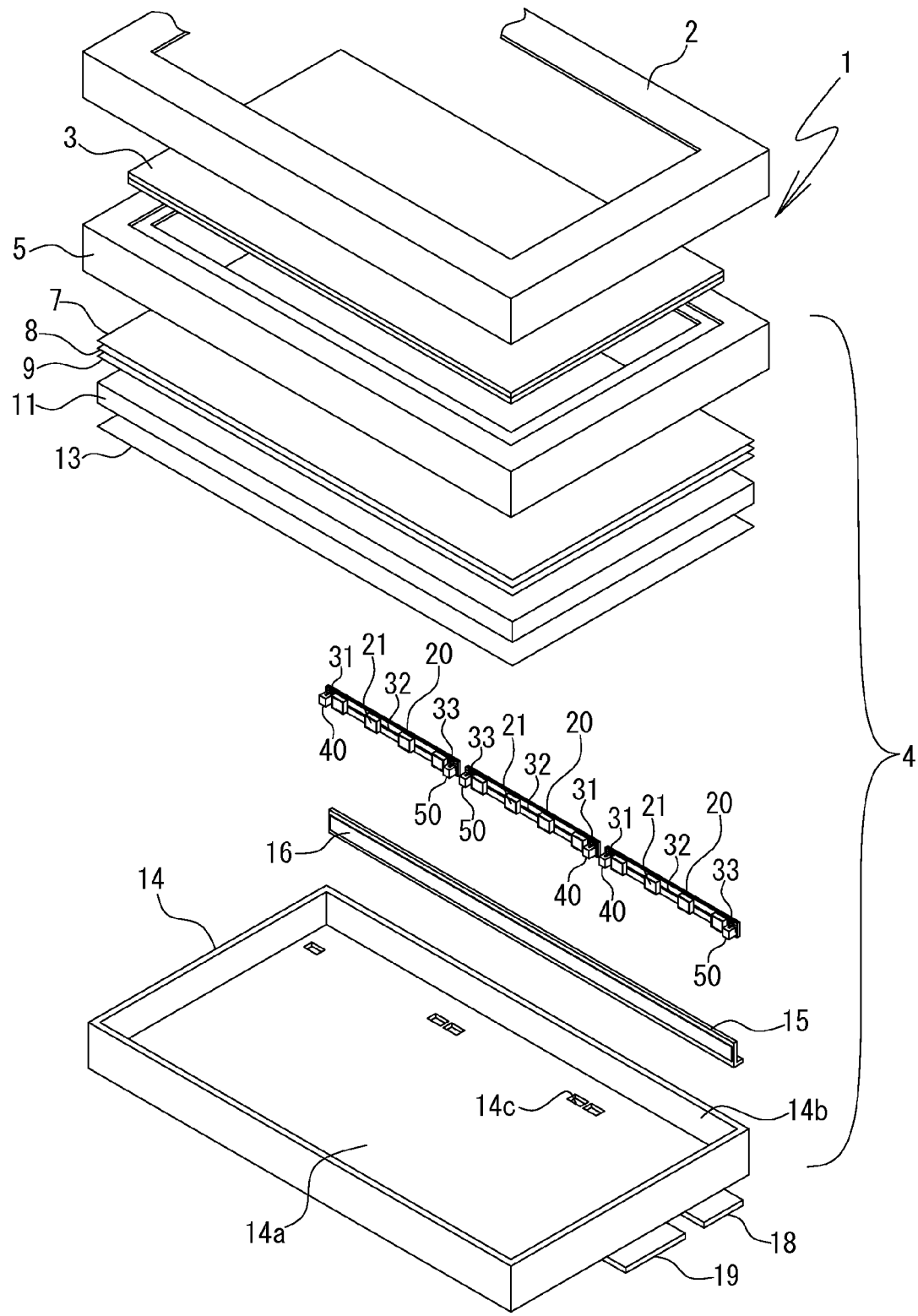
FIG. 1 is an exploded perspective view showing a schematic configuration of a liquid crystal display device of a preferred embodiment of the present invention.
Figure 2:
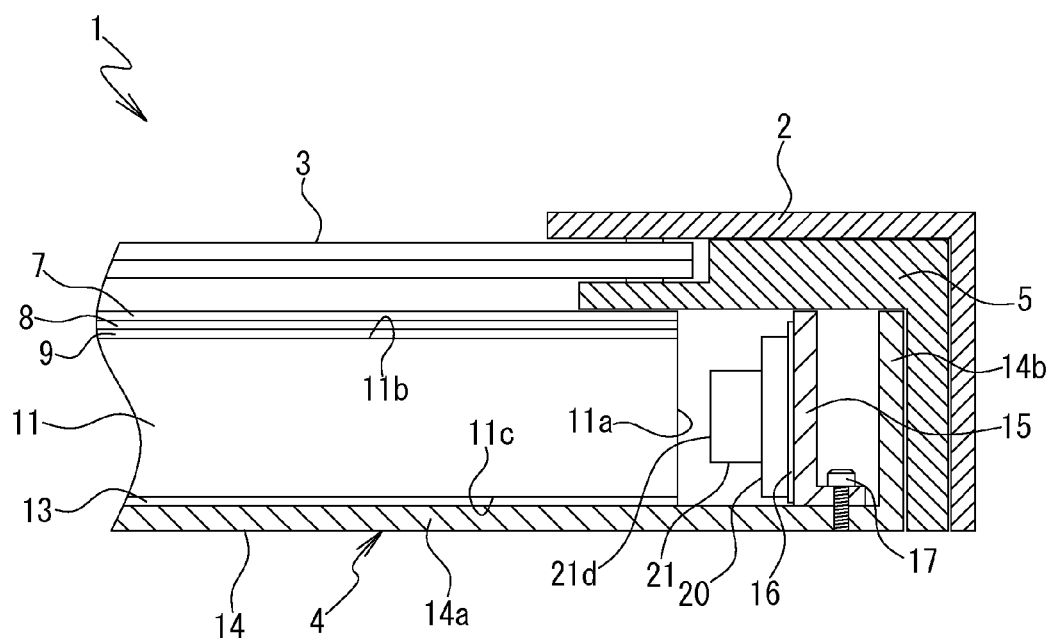
FIG. 2 is an enlarged cross-sectional view showing a relevant portion of the liquid crystal display device shown in FIG. 1 after being assembled.

FIG. 1 is an exploded perspective view showing a schematic configuration of a liquid crystal display device 1 of a preferred embodiment of the present invention. FIG. 2 is an enlarged cross-sectional view showing a relevant portion of the liquid crystal display device 1. The liquid crystal display device 1 includes a bezel 2, a liquid crystal display panel 3 and a backlight unit 4 as shown in FIGS. 1 and 2.

The bezel 2 has a square frame shape with an opening so as to cover edge portions of the liquid crystal display panel 3, and is arranged to, together with a backlight chassis 14 to be described later, ensure strength of the entire liquid crystal display device 1. The liquid crystal display panel 3 includes two glasses that are bonded together, and liquid crystals are filled in a space between the glasses. The liquid crystal display panel 3 is capable of displaying an image on its front surface.

The backlight unit 4 defines a so-called side (edge) illuminating device. The backlight unit 4 includes a frame 5, optical sheets 7 to 9, a light guide plate 11, a reflection sheet 13, the backlight chassis 14, a fixing plate 15, and three LED substrates 20 as shown in FIG. 1. The frame 5 has a square frame shape with an opening, and is arranged to fix the optical sheets 7 to 9, the light guide plate 11 and the reflection sheet 13, which are stacked in this order from the top, to the backlight chassis 14. The optical sheets 7 to 9, the light guide plate 11 and the reflection sheet 13 define optical members arranged to adjust the properties (e.g., refraction, diffraction, reflection) of light that enters the liquid crystal display panel 3 from LEDs 21 included on the LED substrates 20.

The backlight chassis 14 is made of a metal plate such as aluminum that possesses electrical conductivity. The backlight chassis 14 has the shape of a box of low height that is formed through bending processing of the metal plate. The backlight chassis 14 houses the optical sheets 7 to 9, the light guide plate 11, the reflection sheet 13, the fixing plate 15, and the LED substrates 20.

The light guide plate 11 has a rectangular shape when seen in a plan view, and is preferably made of a transparent plate having a thickness of about 3 to 4 mm. The light guide plate 11 includes alight incidence surface 11a arrange to obtain light from the LEDs 21, and a light emitting surface 11b arrange to emit the light upward (in a direction to project the light) obtained from the light incidence surface 11a. The light incidence surface 11a is defined by a given side surface of the light guide plate 11, and the light emitting surface 11b is defined by a front surface of the light guide plate 11.

The light guide plate 11 is arranged to repeatedly reflect the light, which enters from the light incidence surface 11a, between the light emitting face (front face) 11b and a back surface 11c, which is the opposite surface to the light emitting surface 11b, to planarly diffuse the light inside the light guide plate 11. The light guide plate 11 includes a plurality of scattering members (not shown) on the back surface 11c, which are arranged to scatter the light, which enters from the light incidence surface (side surface) 11a, and emit the light from the light emitting surface (front surface) 11b. The scattering members are preferably provided thereon by dotting paint containing a white pigment in a printing method on the back surface 11c of the light guide plate 11, or are preferably provided thereon by forming a plurality of concave portions on the back surface 11c of the light guide plate 11.

In addition, the LEDs 21 provided to the LED substrates 20 are disposed close to the light incidence surface 11a of the light guide plate 11. Further, light emitting surfaces 21d of the LEDs 21 are disposed along the light incidence surface 11a of the light guide plate 11, having a given space therebetween so as to be opposed to the light incidence surface 11a. In the present embodiment, the three LED substrates 20 are fixed so as to be disposed laterally while standing (erecting) on the fixing plate 15 having the shape of the letter "L" that is provided so as to stand on a bottom plate 14a in the vicinity of a side wall 14b of the backlight chassis 14.

The reflection sheet 13 is disposed so as to cover the back surface 11c, which is the opposite surface to the light emitting surface 11b. In the present embodiment, the reflection sheet 13 is disposed on the bottom plate 14a of the backlight chassis 14. The reflection sheet 13 is arranged to reflect the light, which is emitted from the back surface 11c of the light guide plate 11, toward the light guide plate 11. The reflection sheet 13 preferably defines a resin sheet having a thickness of about 0.1 to 2 mm. The reflection sheet 13 is preferably painted white to increase use efficiency of the light and to enhance brightness of the light on the light emitting surface 11b of the light guide plate 11 by efficiently reflecting the light, which is emitted from the back surface 11c of the light guide plate 11, toward the light guide plate 11.

The three optical sheets 7 to 9 define resin sheets, which have a thin rectangular shape when seen in a plan view. The three optical sheets 7 to 9 are defined by a stack of the polarization selective reflection sheet 7, the lens sheet 8, and the diffusion sheet 9, which have a thickness of about 0.1 to 0.5 mm, and are stacked in this order from the top and disposed on the light guide plate 11.

In the present embodiment, the diffusion sheet 9 is used to diffuse the light emitted from the light guide plate 11, allowing uniformalization of brightness distribution of the light.

The lens sheet 8 is used to gather the light emitted from the diffusion sheet 9, allowing enhancement of front brightness of the light. The polarization selective reflection sheet 7 is used to selectively reflect the light emitted from the lens sheet 8 so that the light is not absorbed by a polarizing plate (not shown) that is attached on the underside of the liquid crystal display panel 3.

The backlight unit 4 is capable of converting the light from the LEDs 21 into planate light with the use of the optical sheets 7 to 9, the light guide plate 11 and the reflection sheet 13, and projecting the light onto a back surface of the liquid crystal display panel 3. A power board 18 arranged to supply power to the LED substrates 20, and a control board 19 arranged to drive the liquid crystal display panel 3 are provided behind the backlight chassis 4.

Next, a description of the LED substrates 20 of the present embodiment of the present invention will be provided with reference to FIGS. 3 to 8. Each of the LED substrates 20 includes a radiating plate 22 made from metal such as aluminum that possesses electrical conductivity as shown in FIGS. 3 to 8. The radiating plates 22 have a long rectangular shape. Insulating layers 23 are disposed on upper surfaces of the radiating plates 22. The plurality of LEDs 21 (four LEDs 21 per LED substrate 20 in the present embodiment) disposed linearly along a longitudinal direction of the LED substrates 20 (the radiating plates 22) are disposed on the insulating layers 23.

Figure 6:
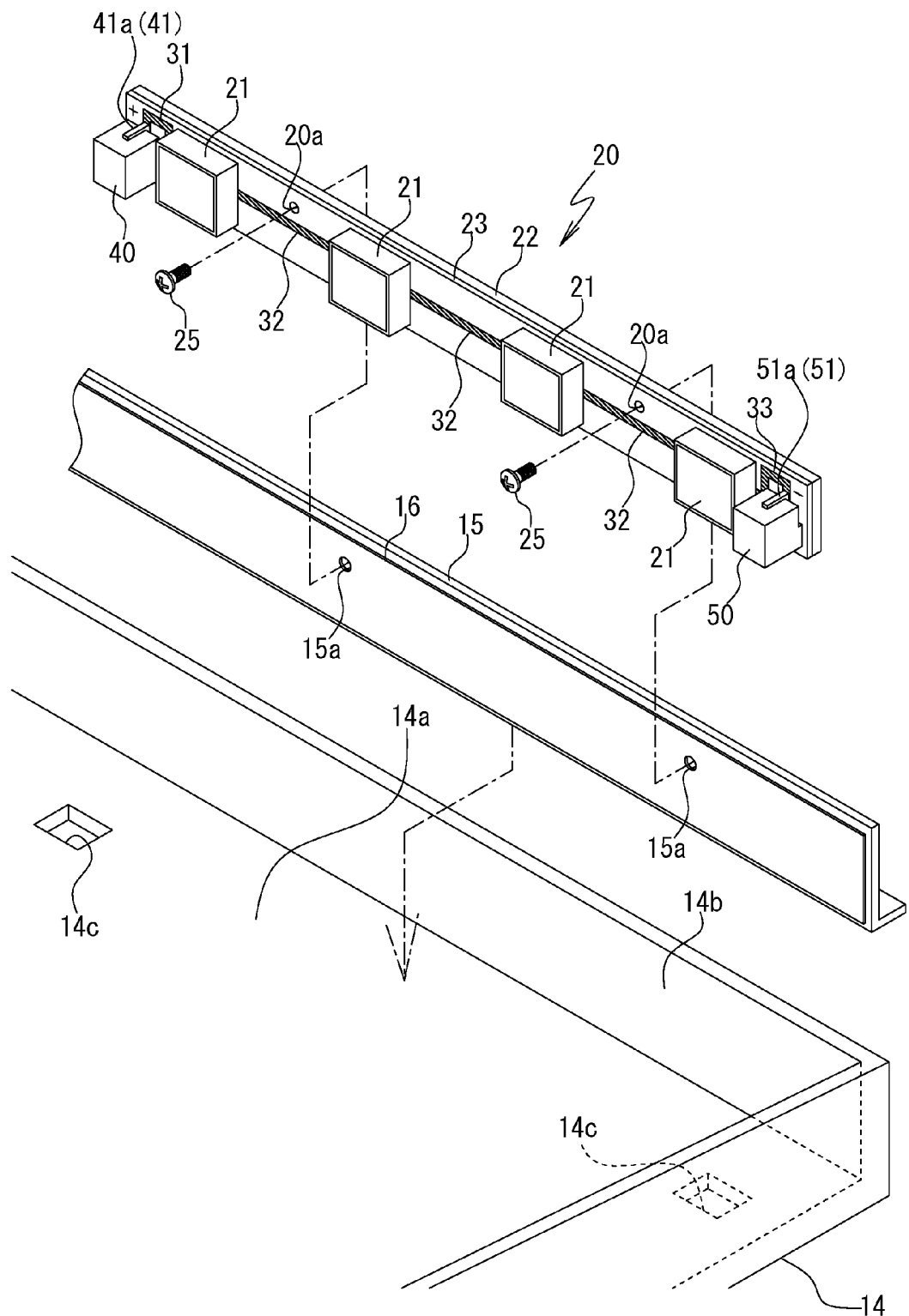
FIG. 6 is an external perspective view showing the LED substrate and a fixing plate to which the LED substrate is to be fixed.
Figure 7A:
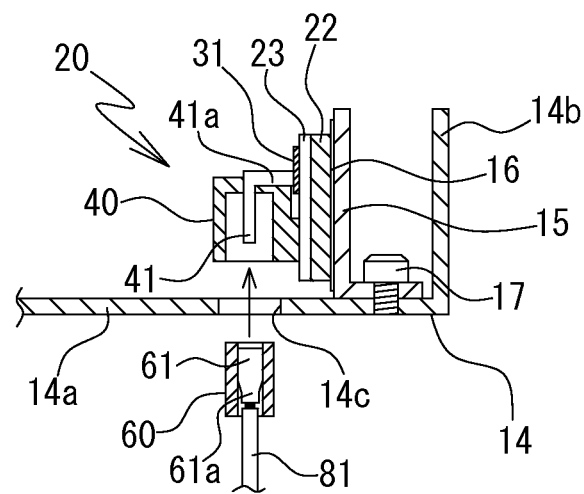
FIG. 7A is a longitudinal cross-sectional view showing the light-source-side substrate connector, where the light-source-side substrate connector is fixed to the fixing plate shown in FIG. 6.
Figure 7B:
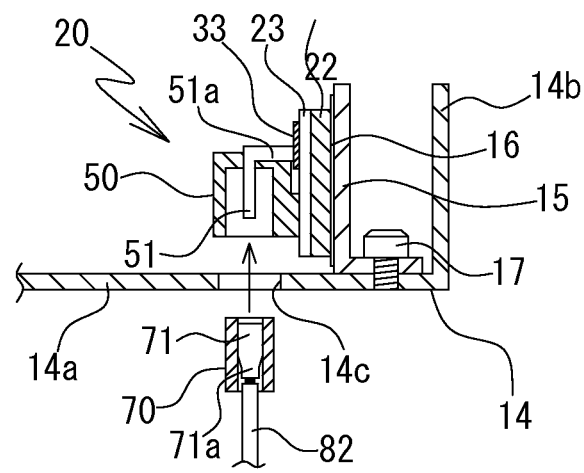
FIG. 7B is a longitudinal cross-sectional view showing the ground-side substrate connector, where the ground-side substrate connector is fixed to the fixing plate shown in FIG. 6.

In the present embodiment, the radiating plates 22 function as base members of the LED substrates 20, and function to curb an increase in temperature caused by heat generation of the LEDs 21. The radiating plates 22 are fixed to the fixing plate 15 while sandwiching therebetween a thermal conductive sheet 16. The fixing plate 15 has the shape of the letter "L", is made from metal such as aluminum that possesses electrical conductivity, and is disposed so as to stand on the bottom plate 14a of the backlight chassis 14. In the present embodiment, through-holes 20a are provided to the LED substrates 20, so that the LED substrates 20 are fixed to the fixing plate 15 by screwing fixation screws 25 into screw holes 15a provided to the fixing plate 15 as shown in FIG. 6. The fixing plate 15 is attached to the bottom plate 14a of the backlight chassis 14 by a fixation screw 17 (see FIG. 2).

Thus, the heat generated by the LEDs 21 is conveyed to the bottom plate 14a of the backlight chassis 14 via the radiating plates 22 of the LED substrates 20, the thermal conductive sheet 16 and the fixing plate 15, so that the temperature of the LEDs 21 is curbed not to increase excessively.

Each of the LEDs 21 has a package structure such that an LED chip 21a that emits blue light is encapsulated in a transparent resin into which a yellow fluorescent material is mixed, for example, and is capable of emitting white light from its top surface, i.e., the light emitting surface 21d. In the present embodiment, the light emitting surfaces 21d are disposed parallel to plate faces (surfaces) of the LED substrates 20.

Figure 3:
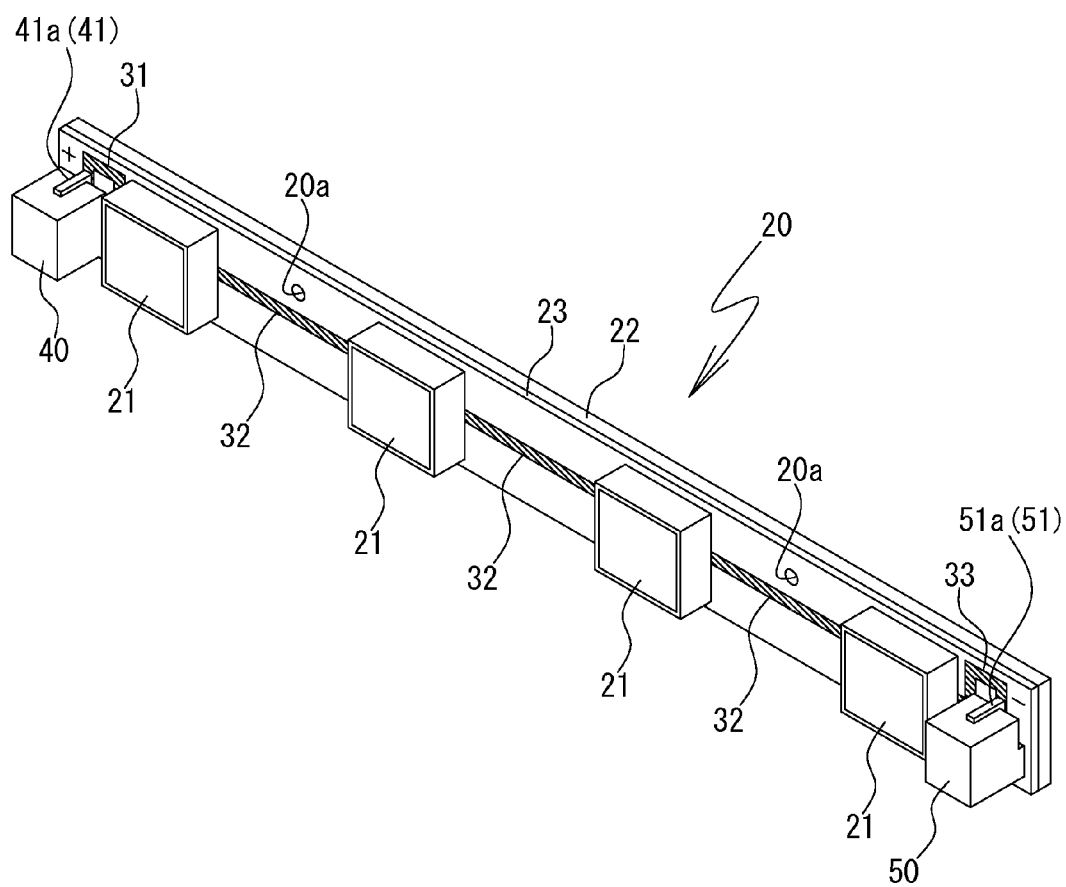
FIG. 3 is an external perspective view showing a schematic configuration of an LED substrate of a preferred embodiment of the present invention.
Figure 4:
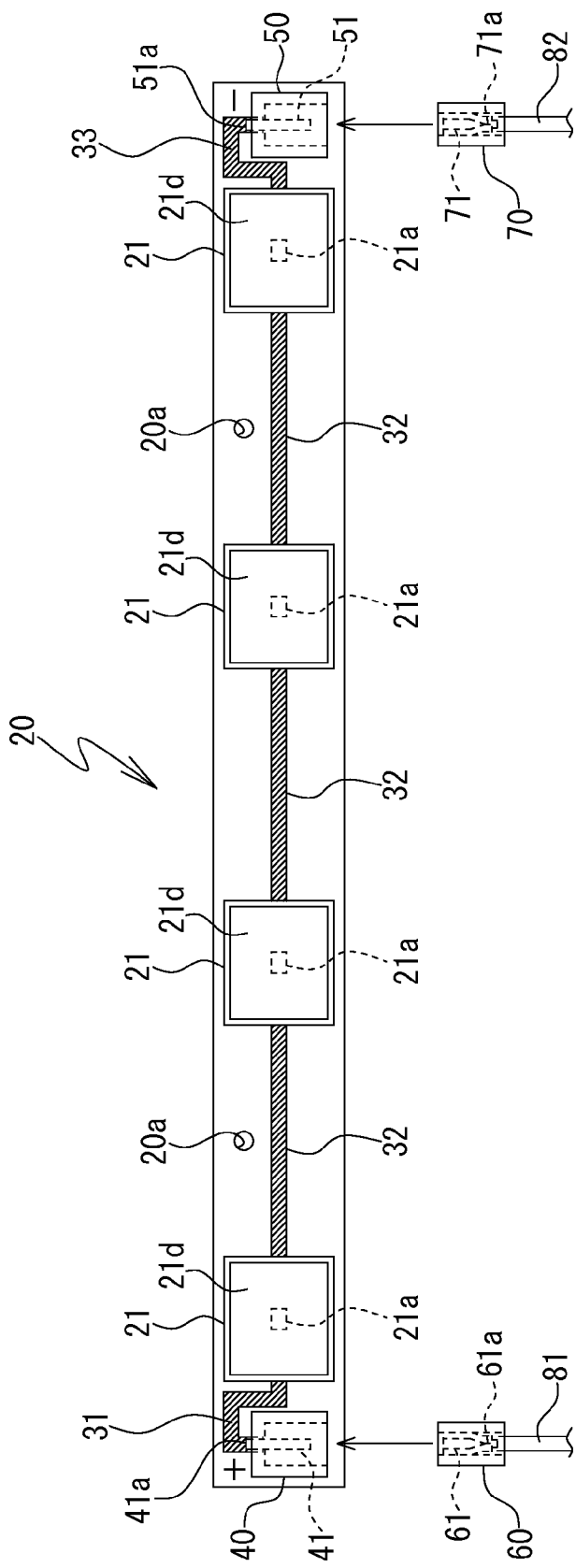
FIG. 4 is a front plan view showing the LED substrate shown in FIG. 3.

A light source pattern 31, connecting patterns 32, and a ground pattern 33 that define wiring patterns are provided in this order from the left on each insulating layer 23 as shown in FIGS. 3, 4 and 5A. The four LEDs 21 are connected to one another in series by the three connecting patterns 32.

To be specific, a negative electrode (cathode electrode) 21c of the first LED 21 from the left and a positive electrode (anode electrode) 21b of the second LED 21 from the left are connected by the connecting pattern 32, a negative electrode (cathode electrode) 21c of the second LED 21 from the left and a positive electrode (anode electrode) 21b of the third LED 21 from the left are connected by the connecting pattern 32, and a negative electrode (cathode electrode) 21c of the third LED 21 from the left and a positive electrode (anode electrode) 21b of the fourth LED 21 from the left are connected by the connecting pattern 32, as shown in FIG. 5A.

A white coating such as a white solder resist is printed on the surfaces of the LED substrates 20 in a silk printing method so that the surfaces are coated with the coating (not shown). The silk printing method is defined by a method of covering a subject to be printed with a silk that functions as a screen, in which an opening with a given pattern is formed, and then printing ink in the subject through the opening, which is also called as a silk screening method.

In the present embodiment, the white coating is printed on the surface of each LED substrate 20 except the areas where the LEDs 21, a light-source-side substrate connector (first substrate connector) 40 and a ground-side substrate connector (second substrate connector) 50, which are to be described later, are disposed. Thus, the white coating reflects the light that comes back to the LED substrates 20 from the light incidence surface 11a of the light guide plate 11, which increases use efficiency of the light.

The light-source-side substrate connector (first substrate connector) 40, and the ground-side substrate connector (second substrate connector) 50 having the same shape as the substrate connector 40 are disposed at the right and left ends of each LED substrate 20 having the configuration described above. In the present embodiment, the light-source-side substrate connector 40 is disposed to the left of the leftmost LED 21, and the ground-side substrate connector 50 is disposed to the right of the rightmost LED 21.

The light-source-side substrate connectors 40 and the ground-side substrate connectors 50 are used to supply electric source (power) to the LEDs 21. The light-source-side substrate connectors 40 each include male light-source-side terminals (positive terminals) 41. The ground-side substrate connectors 50 each include male ground-side terminals (negative terminals) 51.

In the present embodiment, the substrate connectors 40 and 50 have a configuration of being connected to the power board 18 of the liquid crystal display device 1 via cable connectors 60 and 70 and cables 81 and 82 arranged to be fitted and connected from below to the substrate connectors 40 and 50, respectively.

In the present embodiment, the light-source-side substrate connectors 40 are disposed such that their fitting surfaces face downward in a direction parallel to a width direction of the LED substrates 20 so that the light-source-side cable connectors 60 are fitted and connected thereto from below as shown in FIGS. 4 and 5B. In a same manner, the ground-side substrate connectors 50 are disposed such that their fitting surfaces face downward in a direction parallel to a width direction of the LED substrates 20 so that the ground-side cable connectors 70 are fitted and connected thereto from below as shown in FIGS. 4 and 5C.

To be specific, the light-source-side substrate connectors 40 are disposed in a direction such that an insertion direction of the light-source-side cable connectors 60 that define counterpart connectors arranged to be fitted and connected to the substrate connectors 40 is parallel to the width direction of the LED substrates 20 that is perpendicular to the longitudinal direction. The ground-side substrate connectors 50 are disposed in a direction such that an insertion direction of the ground-side cable connectors 70 that define counterpart connectors arranged to be fitted and connected to the substrate connectors 50 is parallel to the width direction of the LED substrates 20 that is perpendicular to the longitudinal direction.

The light-source-side cable connectors 60 each include female light-source-side terminals (positive terminals) 61 arranged to be fitted and electrically connected to the light-source-side terminals (positive terminal) 41, of the light-source-side substrate connectors 40 as shown in FIGS. 4 and 5B. In a same manner, the ground-side cable connectors 70 each include female ground-side terminals (negative terminals) 71 arranged to be fitted and electrically connected to the ground-side terminals (negative terminal) 51 of the ground-side substrate connectors 50 as shown in FIGS. 4 and 5C.

Crimping portions 61a of the light-source-side terminals 61 of the light-source-side cable connectors 60 are connected to end portions of the light-source-side cables 81. In a same manner, crimping portions 71a of the ground-side terminals 71 of the ground-side cable connectors 70 are connected to end portions of the ground-side cables 82. The light-source-side cable connectors 60 have the same shape as the ground-side cable connectors 70.

Openings 14c for connector insertion are provided to the bottom plate 14a of the backlight chassis 14, the openings 14 being larger than the outer diameters of the cable connectors 60 and 70 such that the light-source-side cable connectors 60 and the ground-side cable connectors 70 are insertable in and removable respectively from the light-source-side substrate connectors 40 and the ground-side substrate connectors 50 of the LED substrates 20 that are fixed to the bottom plate 14a of the backlight chassis 14 as shown in FIGS. 1, 6, 7A and 7B. This configuration allows easy handleability of the cable connectors 60 and 70, and easy wiring of the cables 81 and 82 to the power board 18 disposed behind the bottom plate 14a.

The light source pattern 31 is connected to the positive electrode (anode electrode) 21b of the first LED 21 from the left end of each LED substrate 20, and is also connected to a tip 41a of the light-source-side terminal (positive terminal) 41 of the light-source-side substrate connector 40 as shown in FIGS. 3, 4 and 5A. In addition, the ground pattern 33 is connected to the negative electrode (cathode electrode) 21c of the first LED 21 from the right end of each LED substrate 20 (fourth LED 21 from the left end), and is also connected to a tip 51a of the gourd-side terminal (negative terminal) 51 of the group-side substrate connector 50 as shown in FIGS. 3, 4 and 5A.

Thus, each LED substrate 20 has the configuration that the four LEDs 21 are connected in series between the light-source-side terminal 41 of the light-source-side substrate connector 40 and the ground-side terminal 51 of the ground-side substrate connector 50.

Figure 12:
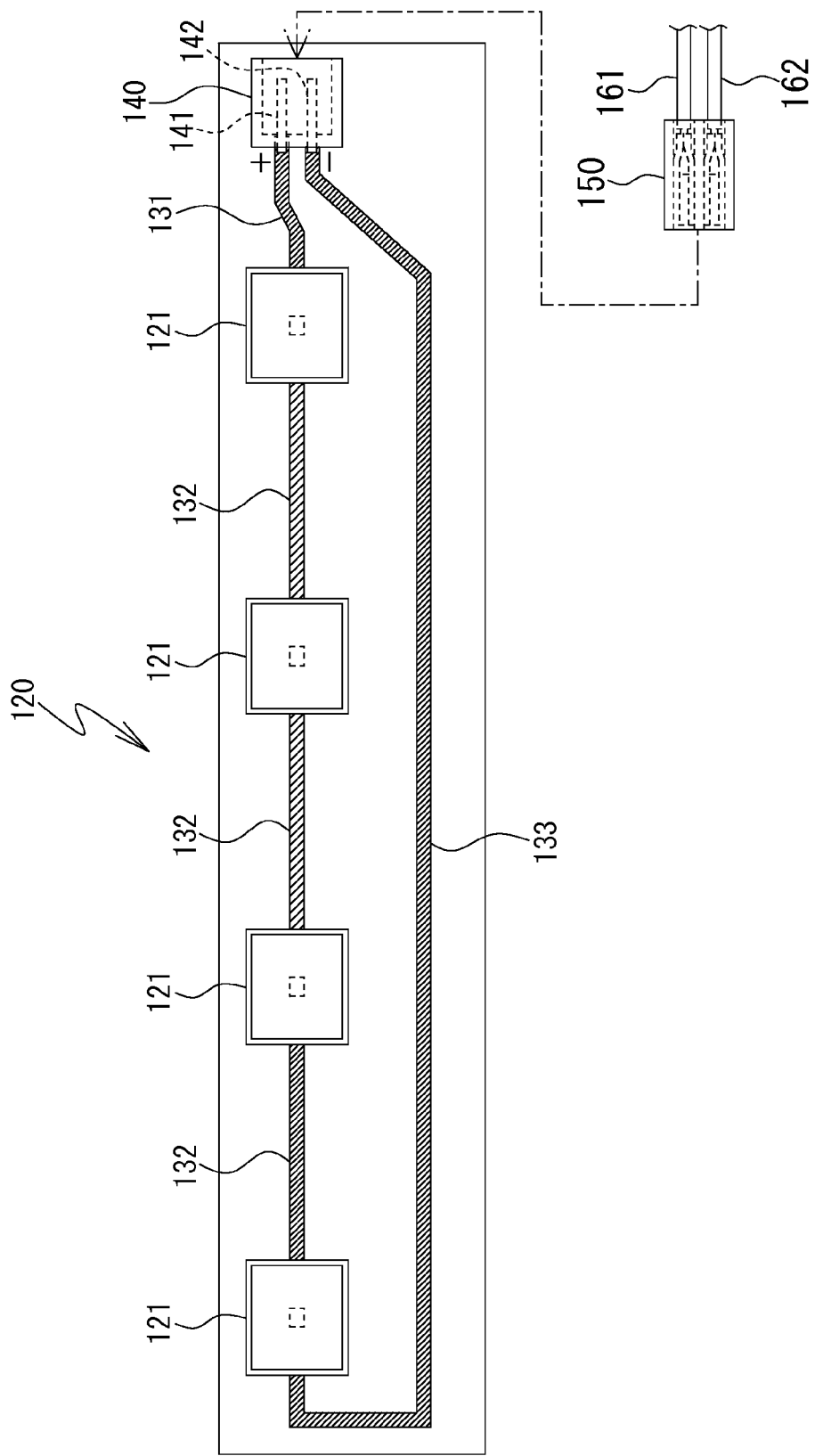
FIG. 12 is a front plan view showing a conventional LED substrate.

To be specific, in each LED substrate 20 having the configuration described above, the two single terminal connectors of the light-source-side substrate connector (single terminal connector) 40 including the light-source-side terminal 41 and the ground-side substrate connector (single terminal connector) 50 including the ground-side terminal 51 are included and disposed at the right and left ends of each LED substrate 20 so as to sandwich therebetween the LEDs 21 connected in series. Thus, it is unnecessary to provide the ground patterns 133 shown in FIG. 12 and explained above in the description of Background Art, which are adjacent to the LEDs 121, which are disposed linearly along the longitudinal direction of the LED substrates 120 and connected to one another in series, in the width direction of the LED substrates 120, and extend linearly along the longitudinal direction of the LED substrates 120.

Thus, downsizing (decreasing) in width of the LED substrates by a width that is required in order to include the ground patterns disposed linearly along the longitudinal direction of the LED substrates can be achieved, whereby a thin profile of the backlight unit 4 that houses these LED substrates 20, in other words, a thin profile of the liquid crystal display device 1 can be achieved, which improves the design property of the liquid crystal display device 1.

In addition, in each LED substrate 20 having the configuration described above, the two single terminal connectors of the light-source-side substrate connector (single terminal connector) 40 including the one light-source-side terminal 41 and the ground-side substrate connector (single terminal connector) 50 including the one ground-side terminal 51 are included and disposed at the right and left ends of each LED substrate 20 so as to sandwich therebetween the LEDs 21 connected in series, which is different from the configuration of the conventional connector (double terminal connector) 140 including the light-source-side terminal 141 and the ground-side terminal 142. Thus, the right and left ends of the LED substrates 20 can have the symmetrically same shape.

That is, disposing the light-source-side substrate connectors 40 (or the ground-side substrate connectors 50) to the left of the leftmost LEDs 21 and disposing the ground-side substrate connectors 50 (or the light-source-side substrate connectors 40) to the right of the rightmost LEDs 21 allows the right and left ends of the LED substrates to have the same shape. In addition, the light-source-side substrate connectors 40 and the ground-side substrate connectors 50 define small-sized single terminal connectors, each of which includes one terminal. Thus, the spaces of the light-source-side substrate connectors 40 and the ground-side substrate connectors 50 (the areas where substrate connectors 40 and 50 are disposed) can be made smaller than the spaces of the conventional substrate connectors (double terminal connectors) 140, each of which includes two terminals.

As described above, the LED substrates 20 have the configuration that the light-source-side substrate connectors 40 and the ground-side substrate connectors 50 arranged to supply power to the LEDs 21 included on the LED substrates 20 are included and disposed at the right and left ends of the LED substrates 20, so that the right and left ends of the LED substrates 20 can have the same shape, especially in this case, the symmetrically same shape as shown in FIG. 4. Thus, the distances between the LEDs 21 of the plurality of LED substrates 20 can be made uniform even when the plurality of LED substrates are disposed laterally.

Figure 8:
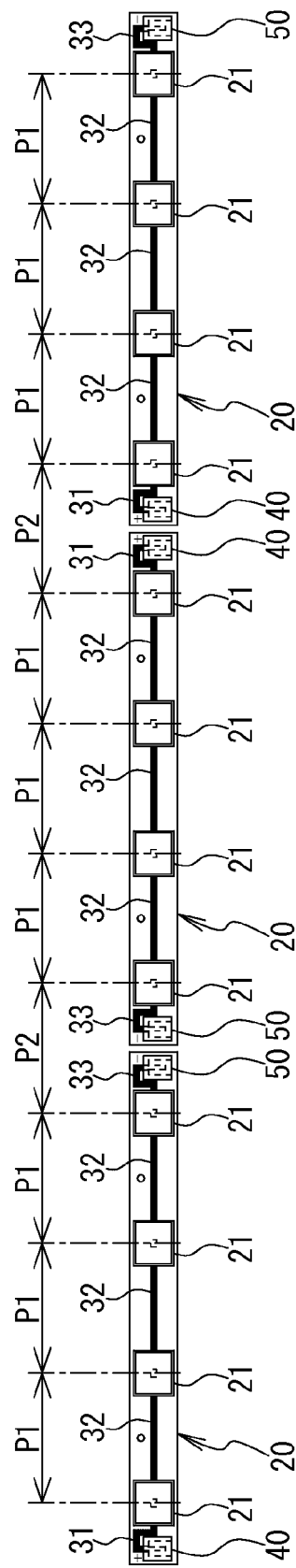
FIG. 8 is a plan view showing three LED substrates that are laterally disposed.

When three LED substrates 20 are disposed laterally in the longitudinal direction thereof, distances P2 between the adjacent LEDs 21 of the adjacent LED substrates 20 can be made equal to distances P1 between the adjacent LEDs 21 of each LED substrate 20 as shown in FIG. 8. Thus, the three LED substrates 20 can be disposed such that the distances between the LEDs 21 are all uniform.

Figure 13:
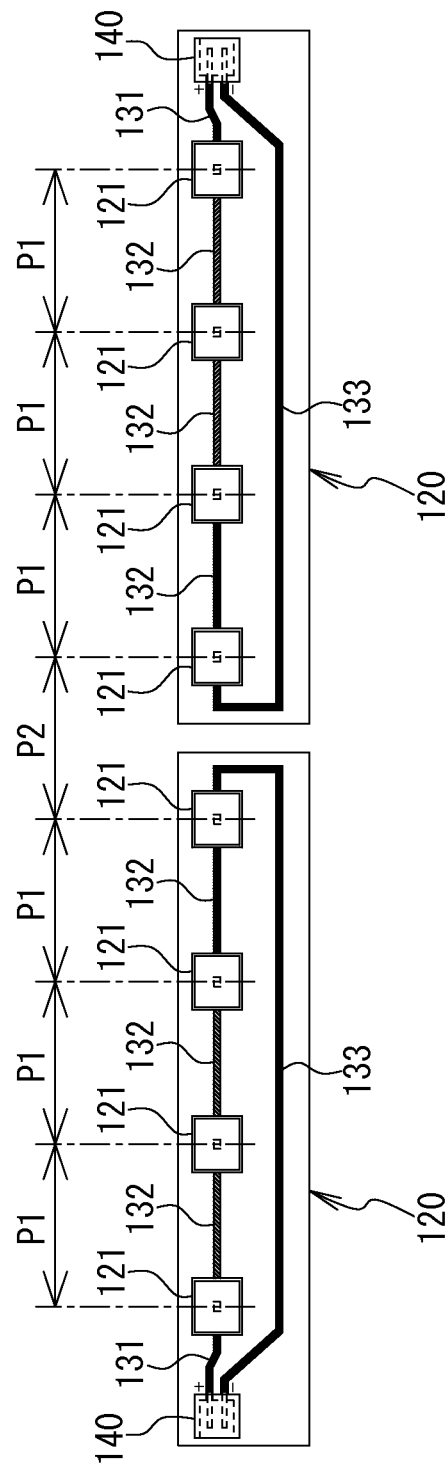
FIG. 13 is a plan view showing two conventional LED substrates that are laterally disposed.
Figure 14A:
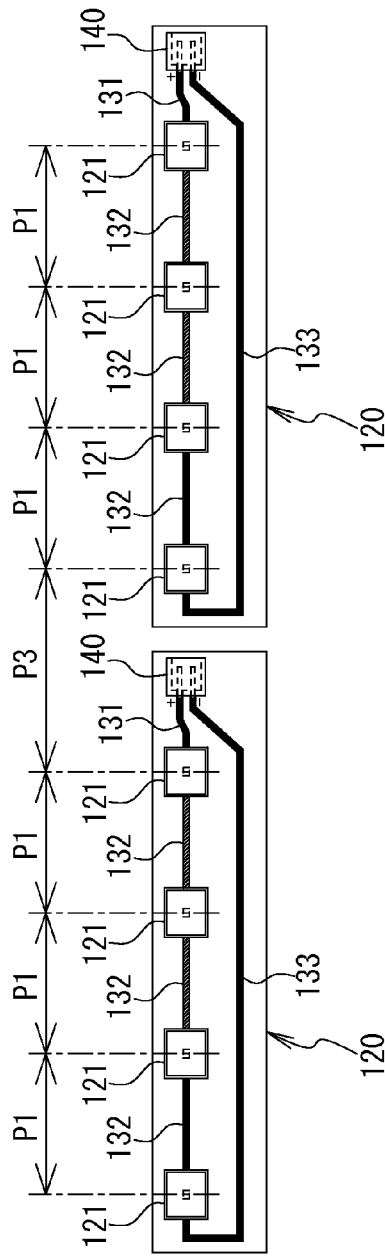
FIG. 14A is a plan view showing two conventional LED substrates that are laterally disposed.
Figure 14B:
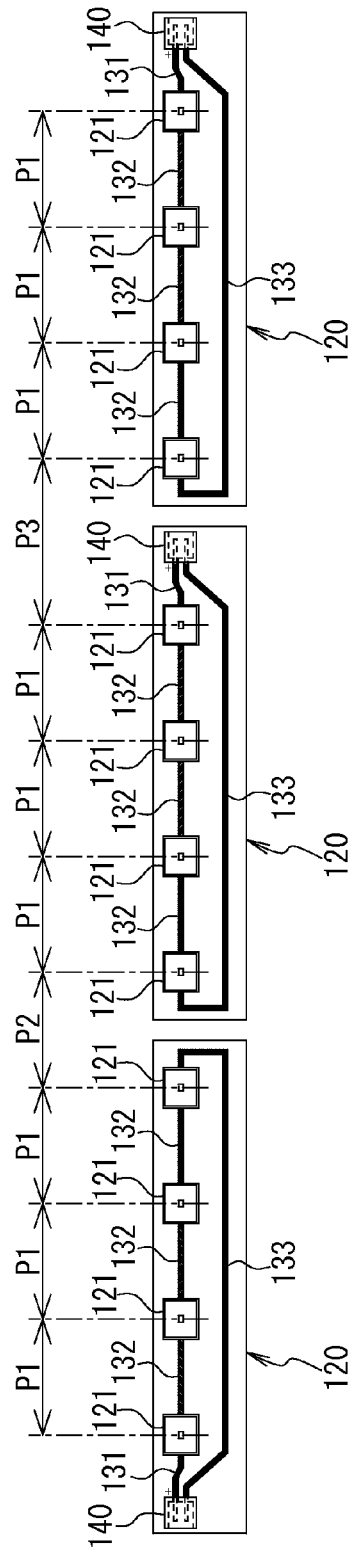
FIG. 14B is a plan view showing three conventional LED substrates that are laterally disposed

That is, the LED substrates 20 of the present invention do not have the configuration that the substrate connectors 140 are disposed at either different ones of right and left ends of the LED substrates 120, which is shown in FIG. 13 and explained above in the description of Background Art. Thus, the problem that the distance between the LEDs 121 of the two adjacent LED substrates 120 is longer, which is indicated as P3 in FIGS. 14A and 14B, can be prevented. Thus, the plurality of LED substrates can be disposed laterally in an efficient fashion such that the distances between the adjacent LEDs are all uniform.

In addition, owing to the configuration of the LED substrates 20 that the light-source-side substrate connectors 40 and the ground-side substrate connectors 50, which are disposed at the left and right ends of the LED substrates 20, are disposed in the directions such that the insertion directions of the light-source-side cable connectors 60 and the ground-side cable connectors 70 that define the counterpart connectors arranged to be fitted and connected to the substrate connectors 40 and 50 respectively are parallel to the width direction of the LED substrates 20, problems such that the adjacent substrate connectors 40 and 50 of the adjacent LED substrates 20 interfere to one another, and such that the cable connectors 60 and 70, and the cables 81 and 82, which are arranged to be fitted and connected to the substrate connectors 40 and 50 respectively, interfere with one another can be prevented even when the plurality of LED substrates 20 are disposed laterally.

Further, owing to the configuration of the LED substrates 20 that the light-source-side substrate connectors 40 and the ground-side substrate connectors 50 disposed at the left and right ends of the LED substrates 20, the LED substrates of one kind having this configuration can suffice when two, three or more than three LED substrates are disposed laterally. Thus, it is unnecessary to prepare the LED substrates 120 of two different kinds on which the substrate connectors 140 are disposed at either different ones of the right and left ends of the LED substrates 120 as shown in FIG. 16, which can reduce the number of components and save a cost.

It is preferable that the plurality of LED substrates 20 are disposed laterally such that polarities of the adjacent substrate connectors of the adjacent LED substrates 20 are same (positive polarities, or negative polarities). Owing to the configuration of the LED substrates 20 that the light-source-side substrate connectors 40 are disposed adjacent to each other in the adjacent LED substrates 20, and the ground-side substrate connectors 50 are disposed adjacent to each other in the adjacent LED substrates 20, a problem such as a short that occurs when the substrate connectors 40 and 50 having the opposite polarities are disposed adjacent to each other can be prevented.

Figure 9:
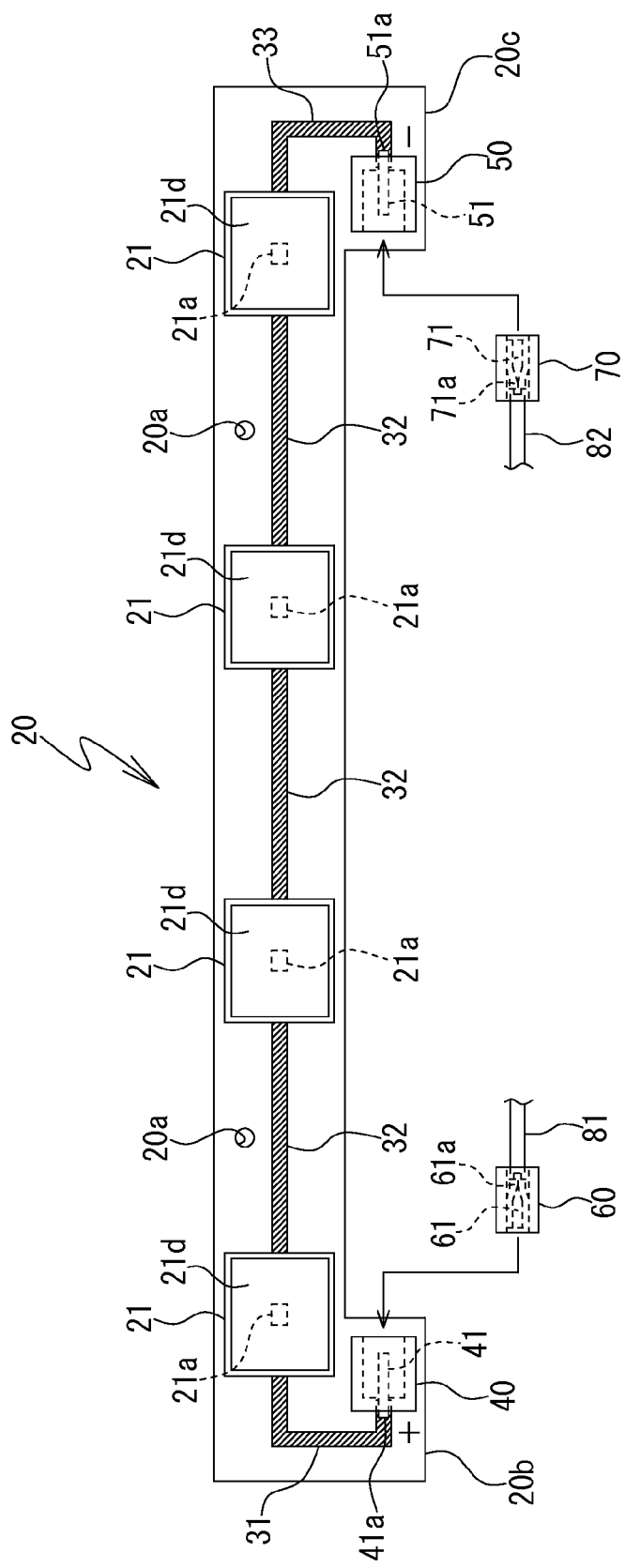
FIG. 9 is a plan view showing the LED substrate of a modified embodiment.
Figure 10:
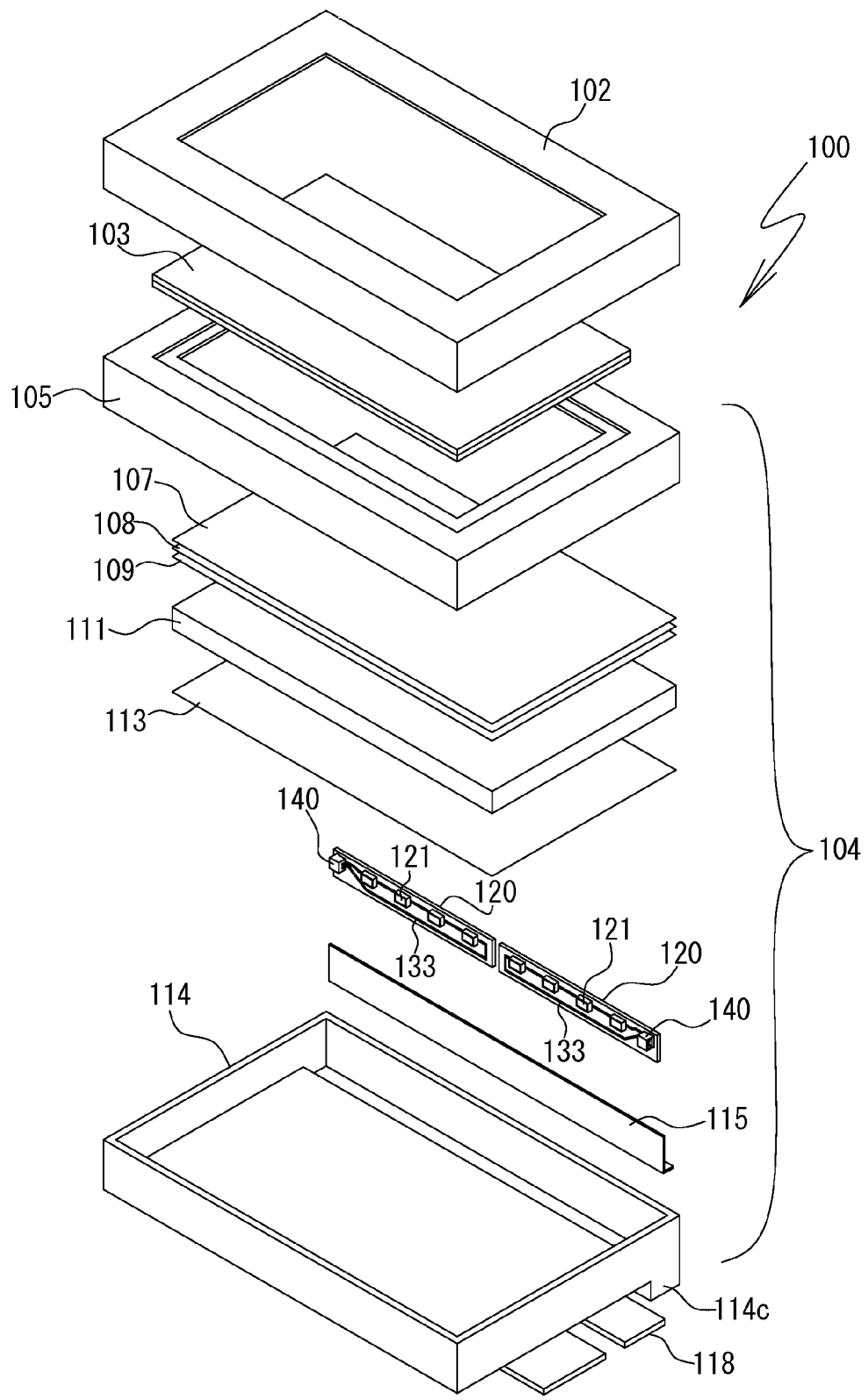
FIG. 10 is an exploded perspective view showing a schematic configuration of a conventional liquid crystal display device.

Next, a description of a modified embodiment of the above-described embodiment will be provided with reference to FIG. 9. Explanations of the same components as those in the above-described embodiment are omitted, and different respects are explained mainly, providing the same reference numerals as those in the above-described embodiment to the same components.

FIG. 9 is a view showing the LED substrate 20 of the modified embodiment, where the LED substrate 20 includes a convex portion 20b that is protruded downward from a left end portion of the LED substrate 20. The light-source-side substrate connector 40 is disposed on the convex portion 20b. One end of the light source pattern 31 extends to be connected to the light-source-side terminal 41 of the light-source-side substrate connector 40. In addition, the LED substrate 20 includes a convex portion 20c that is protruded downward from a right end portion of the LED substrate 20. The ground-side substrate connector 50 is disposed on the convex portion 20c. One end of the ground pattern 33 extends to be connected to the ground-side terminal 51 of the ground-side substrate connector 50.

Figure 11:
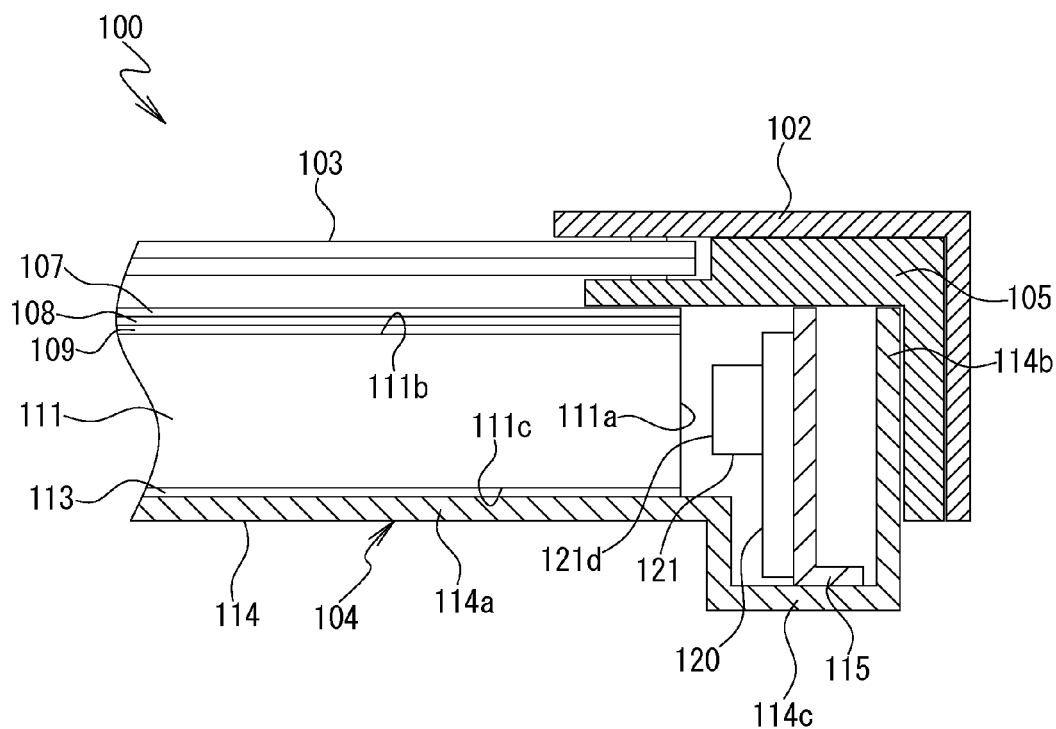
FIG. 11 is an enlarged cross-sectional view showing a relevant portion of the liquid crystal display device shown in FIG. 10 after being assembled.

The LED substrates 20 of the modified embodiment are capable of being attached to the fixing plate 115 standing on the convex portion 114c of the conventional backlight chassis 114 shown in FIG. 11 and explained above in the description of Background Art, and thus are used when the backlight chassis 114 has a height (space) enough to house the LED substrates 20 in the standing position.

In the modified embodiment, the light-source-side substrate connectors 40 are disposed on the convex portion 20b such that their fitting direction (insertion direction) to the light-source-side cable connectors 60 are lateral (parallel to the longitudinal direction of the LED substrates 20) and corresponds to a leftward direction (outward) in the LED substrates 20. In addition, the ground-side substrate connectors 50 are disposed on the convex portion 20c such that their fitting direction (insertion direction) to the ground-side cable connectors 70 are lateral (parallel to the longitudinal direction of the LED substrates 20) and corresponds to a rightward direction (outward) in the LED substrates 20. Thus, problems such that the adjacent substrate connectors 40 and 50 of the adjacent LED substrates 20 interfere to one another, and such that the cable connectors 60 and 70, and the cables 81 and 82, which are arranged to be fitted and connected to the substrate connectors 40 and 50 respectively, interfere with one another can be prevented even when the plurality of LED substrates 20 are disposed laterally.

The foregoing description of the preferred embodiments of the LED substrate, the backlight unit and the liquid crystal display device of the present invention has been presented for purposes of illustration and description with reference to the drawings. However, it is not intended to limit the present invention to the embodiments, and modifications and variations are possible as long as they do not deviate from the principles of the present invention. For example, described above in the preferred embodiments is the configuration that the LED substrates 20 are disposed along one side of the light guide plate 11; however, the present invention is not limited to this configuration. Configurations such that the LED substrates 20 are disposed along two or four opposed sides of the light guide plate 11 are preferably used.

The invention claimed is:

1. An LED substrate that comprises:
a radiating plate made from metal;
an insulating layer disposed on an upper surface of the radiating plate;
a plurality of LEDs disposed on an upper surface of the insulating layer linearly along a longitudinal direction of the radiating plate, and connected to each other in series;
a light source pattern disposed at one end on the upper surface of the insulating layer, and connected to the first LED from the one end;
a ground pattern disposed at the other end on the upper surface of the insulating layer, and connected to the first LED from the other end;
a first connector disposed at one end on the upper surface of the insulating layer, and comprising a light-source-side terminal; and
a second connector disposed at the other end on the upper surface of the insulating layer, and comprising a ground-side terminal, wherein
the light source pattern is connected to the light-source-side terminal of the first connector,
the ground pattern is connected to the ground-side terminal of the second connector,
the first connector is disposed in a direction such that an insertion direction of a counterpart connector arranged to be fitted and connected to the first connector is parallel to a width direction of the radiating plate, the width direction being perpendicular to the longitudinal direction of the radiating plate, and
the second connector is disposed in a direction such that an insertion direction of a counterpart connector arranged to be fitted and connected to the second connector is parallel to the width direction of the radiating plate.

2. A backlight unit comprising:
a light guide plate having a plate shape;
an LED substrate disposed on a side surface of the light guide plate; and a chassis made from metal and arranged to house the light guide plate and the LED substrate, wherein
the LED substrate comprises:
a radiating plate made from metal;
an insulating layer disposed on an upper surface of the radiating plate;
a plurality of LEDs disposed on an upper surface of the insulating layer linearly along a longitudinal direction of the radiating plate, and connected to each other in series;
a light source pattern disposed at one end on the upper surface of the insulating layer, and connected to the first LED from the one end;
a ground pattern disposed at the other end on the upper surface of the insulating layer, and connected to the first LED from the other end;
a first connector disposed at one end on the upper surface of the insulating layer, and comprising a light-source-side terminal; and
a second connector disposed at the other end on the upper surface of the insulating layer, and comprising a ground-side terminal,
the light source pattern is connected to the light-source-side terminal of the first connector,
the ground pattern is connected to the ground-side terminal of the second connector,
the first connector is disposed in a direction such that an insertion direction of a counterpart connector arranged to be fitted and connected to the first connector is parallel to a width direction of the radiating plate, the width direction being perpendicular to the longitudinal direction of the radiating plate, and
the second connector is disposed in a direction such that an insertion direction of a counterpart connector arranged to be fitted and connected to the second connector is parallel to the width direction of the radiating plate.

3. The backlight unit according to claim 2, wherein the LED substrate further comprises:
a through-hole that goes through the insulating layer and the radiating plate; and
a fixing plate made from metal that is disposed to stand on the chassis,
wherein the LED substrate is fixed to the fixing plate by a screw inserted in the through-hole.

4. The backlight unit according to claim 3, further comprising a thermal conductive sheet disposed between the fixing plate and the radiating plate of the LED substrate.

5. A liquid crystal display device comprising:
a liquid crystal display panel; and
the backlight unit according to claim 4 that is disposed behind the liquid crystal display panel.

6. A backlight unit, comprising:
a light guide plate having a plate shape;
an LED substrate disposed on a side surface of the light guide plate; and
a chassis made from metal and arranged to house the light guide plate and the LED substrate, wherein
the LED substrate comprises:
a radiating plate made from metal;
an insulating layer disposed on an upper surface of the radiating plate;
a plurality of LEDs disposed on an upper surface of the insulating layer linearly along a longitudinal direction of the radiating plate, and connected to each other in series;
a light source pattern disposed at one end on the upper surface of the insulating layer, and connected to the first LED from the one end;
a ground pattern disposed at the other end on the upper surface of the insulating layer, and connected to the first LED from the other end;
a first connector disposed at one end on the upper surface of the insulating layer, and comprising a light-source-side terminal; and
a second connector disposed at the other end on the upper surface of the insulating layer, and comprising a ground-side terminal,
the light source pattern is connected to the light-source-side terminal of the first connector,
the ground pattern is connected to the ground-side terminal of the second connector,
the LED substrate further comprises:
a through-hole that goes through the insulating layer and the radiating plate; and
a fixing plate made from metal that is disposed to stand on the chassis, and
the LED substrate is fixed to the fixing plate by a screw inserted in the through-hole.

7. The backlight unit according to claim 6, further comprising a thermal conductive sheet disposed between the fixing plate and the radiating plate of the LED substrate.

8. A liquid crystal display device comprising:
a liquid crystal display panel; and
the backlight unit according to claim 7 that is disposed behind the liquid crystal display panel.

* * * * *